(12) United States Patent
Yang et al.

(10) Patent No.: US 10,204,724 B2
(45) Date of Patent: Feb. 12, 2019

(54) METHOD OF PREPARING A HARD ALUMINUM FILM ON THE SURFACE OF A ND-FE-B MAGNET

(71) Applicant: Yantai Shougang Magnetic Materials Inc., Yantai (CN)

(72) Inventors: Kunkun Yang, Yantai (CN); Zhongjie Peng, Yantai (CN)

(73) Assignee: Yantai Shougang Magnetic Materials Inc., Yantai (CN)

(*) Notice: Subject to any disclaimer, the term of this patent is extended or adjusted under 35 U.S.C. 154(b) by 423 days.

(21) Appl. No.: 14/931,035

(22) Filed: Nov. 3, 2015

(65) Prior Publication Data

US 2016/0125985 A1    May 5, 2016
US 2018/0040398 A9    Feb. 8, 2018

(30) Foreign Application Priority Data

Nov. 4, 2014 (CN) .......................... 2014 1 0610935

(51) Int. Cl.
    *C23C 8/10*            (2006.01)
    *C25D 11/04*         (2006.01)
                  (Continued)

(52) U.S. Cl.
    CPC ............. *H01F 1/057* (2013.01); *C23C 14/16* (2013.01); *C23C 14/24* (2013.01); *C23C 14/325* (2013.01);
                  (Continued)

(58) Field of Classification Search
    CPC ... C23C 8/10–8/18; C25D 9/06; C25D 11/02; C25D 11/03; C25D 11/20; C25D 5/48
    See application file for complete search history.

(56) References Cited

U.S. PATENT DOCUMENTS 6,251,196 B1    6/2001    Nishiuchi et al.
6,275,130 B1    8/2001    Yoshimura et al.
                    (Continued)

FOREIGN PATENT DOCUMENTS

CN       1974845      6/2007
CN     102041506      5/2011
               (Continued)

OTHER PUBLICATIONS

Chinese Search Report for corresponding application No. 2014106109351 dated Nov. 4, 2014, 1 page.
(Continued)

*Primary Examiner* — Lois L Zheng
(74) *Attorney, Agent, or Firm* — William H. Honaker; DickinsonWright PLLC

(57) ABSTRACT

The present invention provides a Nd—Fe—B magnet including a first film of aluminum having a first predetermined hardness and an anti-corrosive coating of oxidized aluminum having a second predetermined hardness on the first film. The second predetermined hardness is at least eight times the first predetermined hardness. The present invention also provides a method for preparing a hard aluminum film on the Nd—Fe—B magnet. The method includes depositing the first film on the Nd—Fe—B magnet under vacuum, disposing the Nd—Fe—B magnet having the first film on the anode, and subjecting the Nd—Fe—B magnet having the first film to the anodic oxidation process under a solution containing an electrolyte present between 15 wt. % to 20 wt. % to form the anti-corrosive coating on the first film to prevent the Nd—Fe—B magnet from corroding. The electrolyte is selected from at least one of sulfuric acid, chromic acid, boric acid, and oxalic acid.

18 Claims, 3 Drawing Sheets

(51) Int. Cl.
*H01F 1/057* (2006.01)
*C23C 14/24* (2006.01)
*H01F 41/02* (2006.01)
*C23C 14/32* (2006.01)
*C23C 14/35* (2006.01)
*C23C 14/16* (2006.01)
*C23C 14/58* (2006.01)
*C25D 11/00* (2006.01)

(52) U.S. Cl.
CPC .......... *C23C 14/35* (2013.01); *C23C 14/5853* (2013.01); *C25D 11/04* (2013.01); *H01F 41/026* (2013.01)

(56) References Cited

U.S. PATENT DOCUMENTS

| | | | |
|---|---|---|---|
| 6,281,774 | B1 | 8/2001 | Nishiuchi et al. |
| 6,326,087 | B1 | 12/2001 | Nishiuchi et al. |
| 6,399,147 | B2 | 6/2002 | Nishiuchi et al. |
| 6,444,328 | B1 | 9/2002 | Nishiuchi et al. |
| 6,878,217 | B2 | 4/2005 | Kikugawa et al. |
| 6,884,513 | B2 | 4/2005 | Kikugawa et al. |
| 7,402,226 | B2 | 7/2008 | Machida et al. |
| 8,163,106 | B2 | 4/2012 | Kikugawa et al. |
| 8,182,619 | B2 | 5/2012 | Morimoto et al. |
| 8,823,478 | B2 | 9/2014 | Tanaka et al. |

FOREIGN PATENT DOCUMENTS

| | | | | |
|---|---|---|---|---|
| CN | 102191464 | * | 9/2011 | ............. C23C 14/02 |
| CN | 102400189 | | 4/2012 | |
| JP | 0995763 | | 4/1997 | |
| JP | 2004111516 | | 4/2004 | |
| JP | 2006245064 | | 9/2006 | |
| JP | 2007049834 | | 2/2007 | |
| JP | 2011190466 | | 9/2011 | |
| JP | 2016514213 | | 5/2016 | |
| WO | 2014158767 | | 10/2014 | |

OTHER PUBLICATIONS

European Search Report for corresponding application No. EP 15 19 2895 dated Mar. 17, 2016, 2 pages.

Japanese Search Report for corresponding application No. 2015-209943 dated Nov. 18, 2016, 11 pages.

* cited by examiner

METHOD OF PREPARING A HARD ALUMINUM FILM ON THE SURFACE OF A ND-FE-B MAGNET

CROSS REFERENCE TO RELATED APPLICATION

This application claims the benefit of a Chinese Patent Application having a Serial number of CN 201410610935.1, published as CN 104480475A and filed on Nov. 4, 2014.

BACKGROUND OF THE INVENTION

1. Field of the Invention

The present invention generally relates to a Nd—Fe—B magnet and a method of preparing a hard aluminum film on the surface of the Nd—Fe—B magnet.

2. Description of the Prior Art

Due to the potential difference between the Nd-rich phase and the $Nd_2Fe_{14}B$ phase, and the hydrogen absorption properties of an Nd—Fe—B magnet, it is very easy for the Nd—Fe—B magnet to corrode. To prevent the Nd—Fe—B magnet from corroding, it is known in the art to provide an anti-corrosive coating layer on the surface of the Nd—Fe—B magnet. The known methods include:
  a. Electroplating—a widely used method for the preparation of an anti-corrosion coating on the surface of the Nd—Fe—B magnet. However, the use of the electroplating method is becoming more and more restrictive because the electroplating method damages the Nd—Fe—B magnet and the environment.
  b. Arc ion plating, magnetron sputtering, magnetic control arc ion plating, and vacuum evaporation methods are generally used to form a first film of aluminum on the surface of the Nd—Fe—B magnet. However, the first film of aluminum on the surface of the Nd—Fe—B magnets is soft which can be easily damaged thereby affecting the anti-corrosion effect of the first film of aluminum.

SUMMARY OF THE INVENTION

The invention provides for a method including the steps of depositing a first film on the surface of the Nd—Fe—B magnet in the plating machine under a vacuum and subjecting the Nd—Fe—B magnet having the first film to the anodic oxidation process under a solution containing an electrolyte to form an anti-corrosive coating on the surface of the first film to prevent the Nd—Fe—B magnet from corroding.

The invention provides for the Nd—Fe—B magnet including a first film defining a first Vickers hardness covering the Nd—Fe—B magnet and an anti-corrosive coating defining a second Vickers hardness covering the first film on the Nd—Fe—B magnet with the second Vickers hardness being at least eight times the first Vickers hardness of the first film.

ADVANTAGES OF THE INVENTION

The invention provides a simple process for preparing the hard aluminum film on a surface of a Nd—Fe—B magnet. In addition, the invention provides for a lower degree of damage to the Nd—Fe—B magnets. The invention also provides for an increase in the binding force between the anti-corrosive coating of oxidized aluminum and the binding matrix. Specifically, the Vickers hardness for the anti-corrosive coating of oxidized aluminum is eight times higher than the Vickers hardness for the first film of aluminum. The invention further provides for an increase in anti-corrosion for the Nd—Fe—B magnets.

BRIEF DESCRIPTION OF THE DRAWINGS

Other advantages of the present invention will be readily appreciated, as the same becomes better understood by reference to the following detailed description when considered in connection with the accompanying drawings wherein.

DESCRIPTION OF THE ENABLING EMBODIMENT

Figure 1:
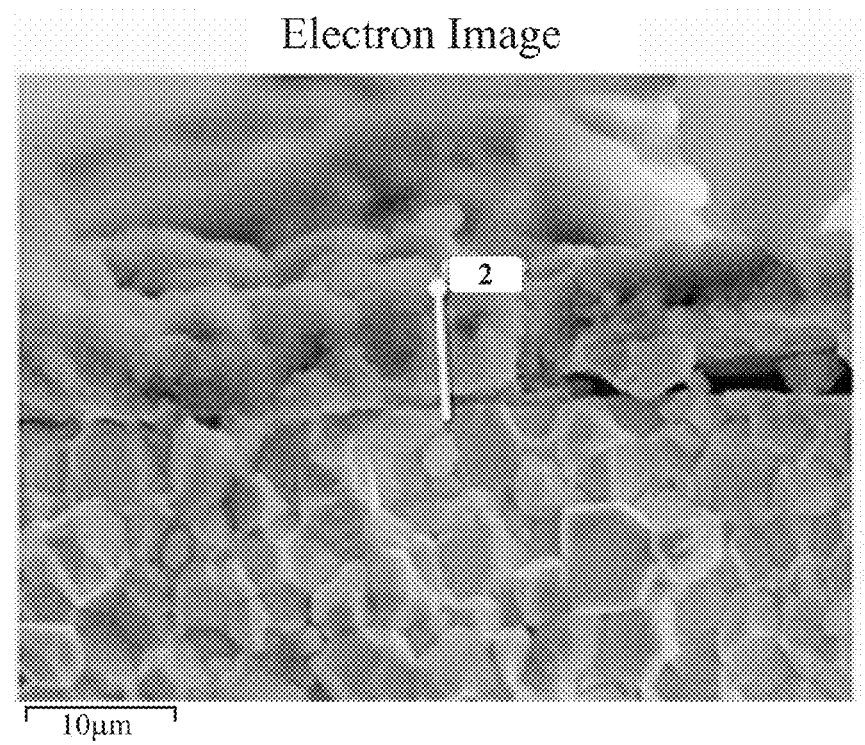
FIG. 1 is a cross-sectional view of the Nd—Fe—B magnet including the anti-corrosive coating of oxidized aluminum.

Referring to the Figures, it is one aspect of the invention to provide a Nd—Fe—B magnet. The Nd—Fe—B magnet includes a first film defining a first Vickers hardness covering the Nd—Fe—B magnet, and an anti-corrosive coating defining a second Vickers hardness covering the first film on the Nd—Fe—B magnet. The second Vickers hardness of the anti-corrosive coating is at least eight times the first Vickers hardness of the first film. The first film covering the Nd—Fe—B magnet is aluminum and the anti-corrosive coating covering the first film on the Nd—Fe—B magnet is oxidized aluminum.

It is another aspect of the present invention to provide a method for preparing a hard aluminum film on a surface of the Nd—Fe—B magnet. The method utilizes a plating machine and an anodic oxidation process. The anodic oxidation process includes a cathode of aluminum and an anode.

The method includes the steps of grinding the Nd—Fe—B magnet, polishing the Nd—Fe—B magnet, and washing the Nd—Fe—B magnet using an alcohol. The next step of the method includes depositing a first film of aluminum having a thickness of between 5 μm and 40 μm on the surface of the Nd—Fe—B magnet in the plating machine under a vacuum. It should be appreciated that the plating machine can use a number of processes to deposit the aluminum onto the surface of the Nd—Fe—B magnet. The number of processes may include, but no limited to arc ion plating, magnetron sputtering, magnetic controlled arc ion plating, and vacuum evaporation.

The step of depositing the first film on the surface of the Nd—Fe—B magnet is further defined as depositing the aluminum having the thickness of between 5 μm and 40 μm on the surface of the Nd—Fe—B magnet in the plating machine under the vacuum having a predetermined pressure range between $2.0 \times 10^{-3}$ Pa and $9.0 \times 10^{-3}$ Pa. Next, an inert gas of Argon is added to the plating machine to raise the predetermined pressure of the vacuum in the plating machine to between 0.2 Pa and 0.8 Pa. The step of depositing the aluminum further includes a step of applying a biasing electric voltage in a range of between 350V and 650V to the Nd—Fe—B magnet to clean the Nd—Fe—B magnet. Then, the biasing electric voltage is reduced to a range of between 100V and 200V to allow depositing of the aluminum on the surface of the Nd—Fe—B magnet.

The next step of the method is subjecting the Nd—Fe—B magnet having the first film to the anodic oxidation process under a solution containing an electrolyte to form an anti-corrosive coating on the surface of the first film to prevent the Nd—Fe—B from corroding. The electrolyte can be selected from at least one of sulfuric acid, chromic acid, boric acid and oxalic acid. The electrolyte is present, in the solution, in an amount of between 15 wt. % to 20 wt. %. The step of subjecting the Nd—Fe—B magnet having the first film to the anodic oxidation process further including a step of disposing the Nd—Fe—B magnet having the first film of aluminum on the anode of the anodic oxidation process. Then, an electric potential of between 12V and 20V is applied between the cathode of aluminum and the anode including the Nd—Fe—B magnet having the first film of aluminum to oxidize the first film of aluminum on the surface of the Nd—Fe—B magnet to produce the anti-corrosive coating of oxidized aluminum on the surface of the first film of aluminum to prevent the Nd—Fe—B magnet from corroding. In other words, by applying the electric potential between the cathode and the anode, the first film of aluminum disposed on the surface of the Nd—Fe—B magnet oxidizes thereby producing the anti-corrosive coating of oxidized aluminum on the surface of the first film of the Nd—Fe—B magnet.

In order to have a better understanding of the present invention, the implementing examples set forth below provide illustrations of the present invention. The implementing examples are only used to illustrate the present invention and do not limit the scope of the present invention.

IMPLEMENTING EXAMPLE 1

Samples of Nd—Fe—B magnets, grinded, polished, and cleaned by alcohol, are placed in a vacuum furnace of an arc ion plating machine. The vacuum furnace of the arc plating machine has the predetermined pressure of between $5 \times 10^{-3}$ Pa and $5.5 \times 10^{-3}$ Pa. Next, the inert gas of Argon is introduced into the vacuum furnace to raise the predetermined pressure of the vacuum furnace to between 0.3 Pa and 0.35 Pa. The biasing electric voltage of 400V is applied to the Nd—Fe—B magnets for 10 min to clean the Nd—Fe—B magnets. The multi-arc ion source in the arc plating machine is switched on with the current being 60 A. After 60 seconds, the biasing electric voltage is reduced to 100 V for 200 minutes to allow for the complete of depositing the aluminum film on the surface of the Nd—Fe—B magnets. The thickness of the aluminum film on the Nd—Fe—B magnets is between 5 μm and 40 μm. The anti-corrosive coating of the oxidized aluminum film is prepared by disposing the Nd—Fe—B magnets having the aluminum film on the anode and disposing the anode including the Nd—Fe—B magnets having the aluminum film in the solution containing the electrolyte of sulfuric acid in the amount of 15 wt. %. The temperature of the solution containing 15 wt. % sulfuric acid is kept between 18° C. and 20° C. The electric potential of 12V is applied, for 2 minutes, between the cathode of aluminum and the anode including the Nd—Fe—B magnets having the aluminum film to oxidize the aluminum film to produce the anti-corrosive coating of the oxidized aluminum film.

Figure 2:
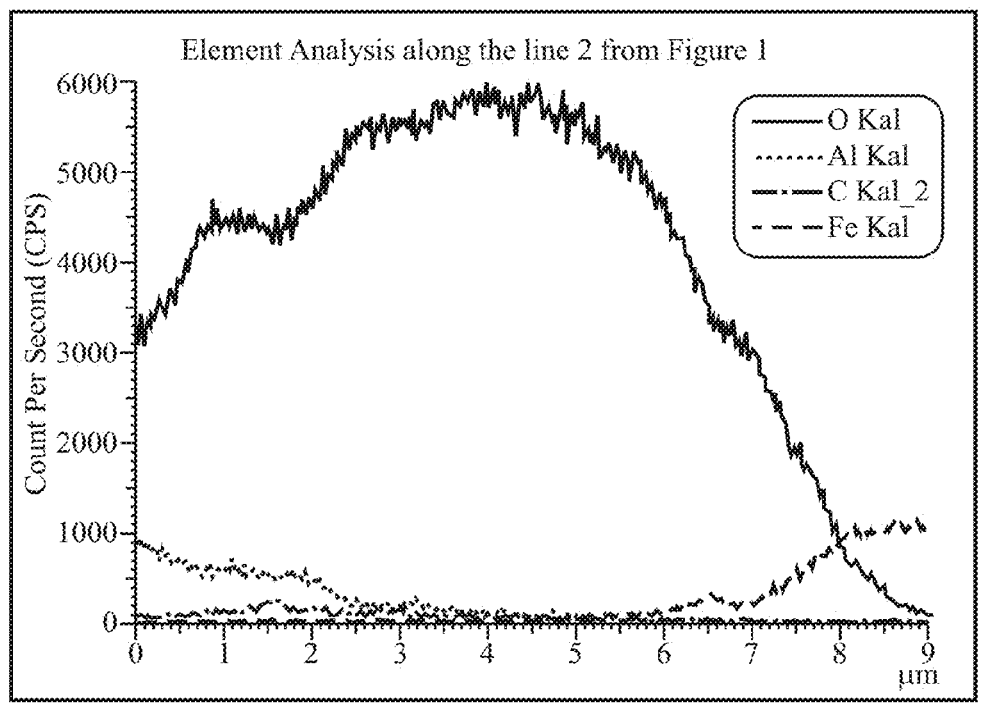
FIG. 2 is a composition vs. depth diagram for the first film of aluminum and the anti-corrosive coating of oxidized aluminum as shown in FIG. 1.
Figure 3:
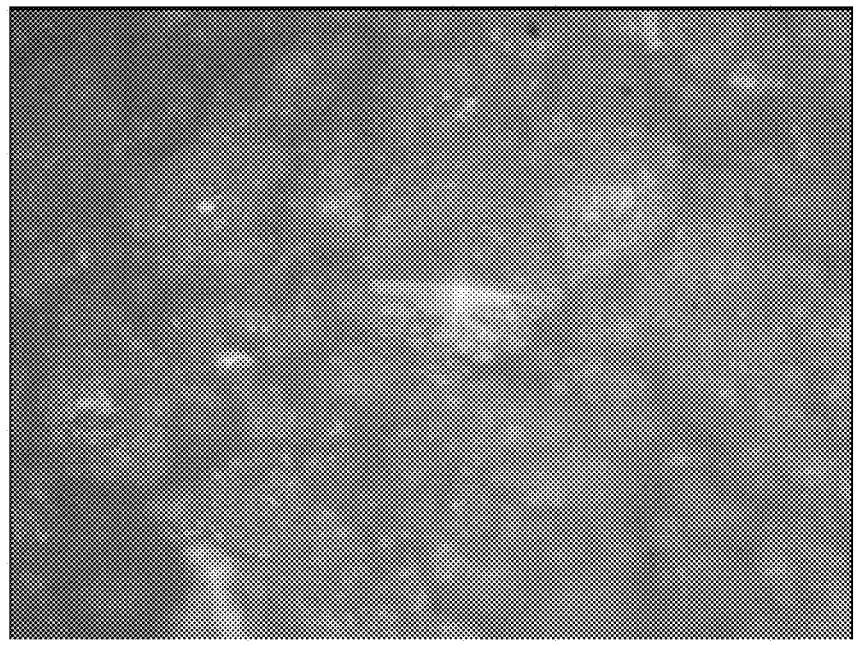
FIG. 3 is a Vickers hardness indentation graph of the anti-corrosive coating of oxidized aluminum.
Figure 4:
FIG. 4 is a Vickers hardness indentation graph for the first film of aluminum.
Figure 5:
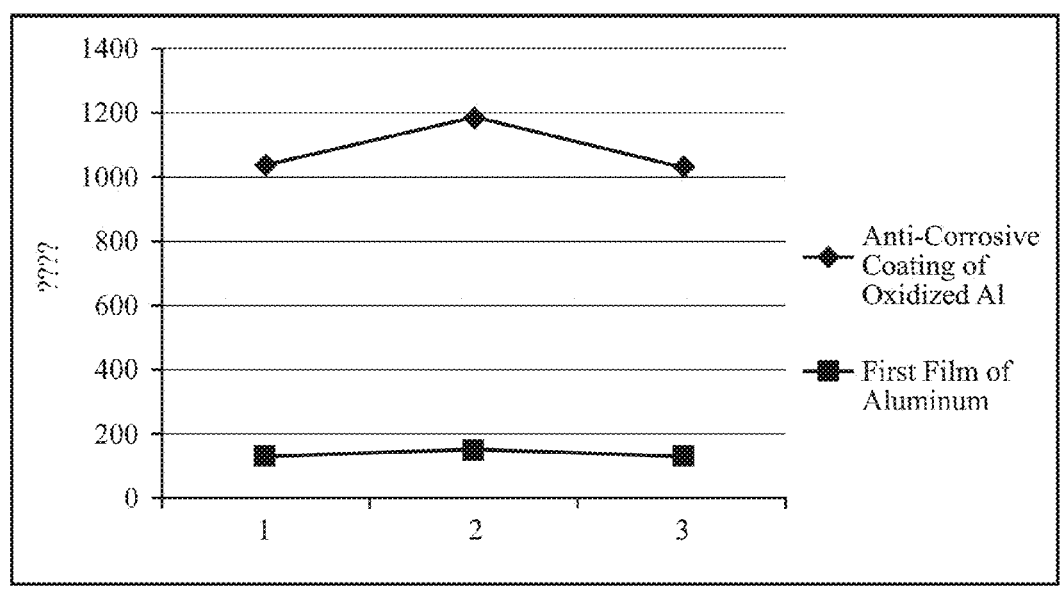
FIG. 5 is a Vickers hardness comparison chart between the anti-corrosive layer of oxidized aluminum as disclosed in the Implementing Example 1 and the first film of aluminum.

The sectional view and component analysis of the hard aluminum film layer are shown in FIG. 1 and FIG. 2, respectively. As shown in FIG. 1, there is a clear separation between the aluminum film and the anti-corrosive coating of the oxidized aluminum film. FIG. 2 indicates the generation of oxygen on the surface of the aluminum film. Specifically, FIG. 2 indicates, as the depth of the anti-corrosive coating of the oxidized aluminum film and the aluminum film increase, the amount of oxygen present in the anti-corrosive coating decreases. FIGS. 3 and 4 show the Vickers hardness indentation comparison of a normal aluminum film and the anti-corrosive coating of the oxidized aluminum film, respectively. FIG. 5 is comparative graph of Vickers hardness of the aluminum film and anti-corrosive coating of the oxidized aluminum film. Comparing FIGS. 3 and FIG. 4, the indentation on the surface of the anti-corrosive coating of the oxidized aluminum film as shown in FIG. 3 is much smaller than on the surface of the normal aluminum film as shown in FIG. 4. FIG. 5 illustrates that the average Vickers hardness of the anti-corrosive coating of the oxidized aluminum film is approximately 1082 which is approximately 8 times the Vickers hardness of the normal aluminum film.

IMPLEMENTING EXAMPLE 2

Samples of Nd—Fe—B magnets, grinded, polished, and cleaned by alcohol, are placed in a vacuum furnace of an arc ion plating machine. The vacuum furnace of the arc plating machine has the predetermined pressure of $2.0 \times 10^{-3}$ Pa. Next, the inert gas of Argon is introduced into the vacuum furnace to raise the predetermined pressure of the vacuum furnace to 0.2 Pa. The biasing electric voltage of 350V is applied to the Nd—Fe—B magnets for 15 min to clean the Nd—Fe—B magnets. The multi-arc ion source in the arc plating machine is switched on with the current being 50A. After 70 seconds, the biasing electric voltage is reduced to 100 V for 200 minutes to allow for the complete of depositing the aluminum film on the surface of the Nd—Fe—B magnets. The thickness of the aluminum film on the Nd—Fe—B magnets is between 5 μm and 40 μm. The anti-corrosive coating of the oxidized aluminum film is prepared by disposing the Nd—Fe—B magnets having the aluminum film on the anode and disposing the anode including the Nd—Fe—B magnets having the aluminum film in the solution containing the electrolyte of sulfuric acid in the amount of 18 wt. %. The electric potential of 15V is applied, for 3 minutes, between the cathode of aluminum and the anode including the Nd—Fe—B magnets having the aluminum film to oxidize the aluminum film to produce the anti-corrosive coating of the oxidized aluminum film.

IMPLEMENTING EXAMPLE 3

Samples of Nd—Fe—B magnets, grinded, polished, and cleaned by alcohol, are placed in a vacuum furnace of an arc ion plating machine. The vacuum furnace of the arc plating machine has the predetermined pressure of $9.0 \times 10^{-3}$ Pa. Next, the inert gas of Argon is introduced into the vacuum furnace to raise the predetermined pressure of the vacuum furnace to 0.8 Pa. The biasing electric voltage of 650V is applied to the Nd—Fe—B magnets for 10 min to clean the Nd—Fe—B magnets. The multi-arc ion source in the arc plating machine is switched on with the current being 70 A. After 50 seconds, the biasing electric voltage is reduced to 200 V for 100 minutes to allow for the complete of depositing the aluminum film on the surface of the Nd—Fe—B magnets. The thickness of the aluminum film on the Nd—Fe—B magnets is between 5 µm and 40 µm. The anti-corrosive coating of the oxidized aluminum film is prepared by disposing the Nd—Fe—B magnets having the aluminum film on the anode and disposing the anode including the Nd—Fe—B magnets having the aluminum film in the solution containing the electrolyte of sulfuric acid in the amount of 20 wt. %. The electric potential of 20V is applied, for 5 minutes, between the cathode of aluminum and the anode including the Nd—Fe—B magnets having the aluminum film to oxidize the aluminum film to produce the anti-corrosive coating of the oxidized aluminum film.

IMPLEMENTING EXAMPLE 4

The process in Implementing Example 4 is similar to the process as set forth in Implementing Example 1. The only differences are magnetron sputtering, magnetic control arc ion plating, or vacuum evaporation is used for depositing the aluminum film on the surface of the Nd—Fe—B magnets and the electrolyte used during the anodic oxidation process is selected from at least one of chromic acid, boric acid, or oxalic acid.

Obviously, many modifications and variations of the present invention are possible in light of the above teachings and may be practiced otherwise than as specifically described while within the scope of the appended claims. These antecedent recitations should be interpreted to cover any combination in which the inventive novelty exercises its utility. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

What is claimed is:

1. A method of preparing a hard aluminum film on a surface of a Nd—Fe—B magnet using a plating machine and an anodic oxidation process using an cathode of aluminum and an anode, said method comprising the steps of;
    depositing a first film on the surface of the Nd—Fe—B magnet in the plating machine under a vacuum,
    said step of depositing the first film being defined as depositing aluminum on the surface of the Nd—Fe—B magnet in the plating machine under the vacuum having a predetermined pressure range between $2.0 \times 10^{-3}$ Pa and $9.0 \times 10^{-3}$ Pa,
    said step of depositing the aluminum further including a step of adding an inert gas of Argon to the plating machine to raise the predetermined pressure of the vacuum in the plating machine to between 0.2 Pa and 0.8 Pa, and
    subjecting the Nd—Fe—B magnet having the first film to the anodic oxidation process under a solution containing an electrolyte to form an anti-corrosive coating on the surface of the first film to prevent the Nd—Fe—B magnet from corroding.

2. The method of preparing the hard aluminum film on the surface of the Nd—Fe—B magnet as set forth in claim 1 wherein said step of depositing the aluminum is further define as depositing the aluminum having a thickness of between 5 µm and 40 µm on the surface of the Nd—Fe—B magnet.

3. The method of preparing the hard aluminum film on the surface of the Nd—Fe—B magnet as set forth in claim 1 wherein said step of depositing the aluminum further includes a step of applying an biasing electric voltage in a range of between 350V and 650V to the Nd—Fe—B magnet to clean the Nd—Fe—B magnet.

4. The method of preparing the hard aluminum film on the surface of the Nd—Fe—B magnet as set forth in claim 3 wherein said step of depositing the aluminum further includes a step of reducing the biasing electric voltage to a range of between 100V and 200V to allow depositing of the aluminum on the surface of the Nd—Fe—B magnet.

5. The method of preparing the hard aluminum film on the surface of the Nd—Fe—B magnet as set forth in claim 1 wherein said step of subjecting the Nd—Fe—B magnet having the first film to the anodic oxidation process is further defined as subjecting the Nd—Fe—B magnet including the first film of aluminum to the anodic oxidation process to the electrolyte selected from at least one of sulfuric acid and chromic acid and boric acid and oxalic acid and present in an amount of between 15 wt. % and 20 wt. %.

6. The method of preparing the hard aluminum film on the surface of the Nd—Fe—B magnet as set forth in claim 1 wherein said step of subjecting the Nd—Fe—B magnet having the first film further includes a step of disposing the Nd—Fe—B magnet including the first film of aluminum on the anode of the anodic oxidation process.

7. The method of preparing the hard aluminum film on the surface of the Nd—Fe—B magnet as set forth in claim 6 wherein said step of subjecting the Nd—Fe—B magnet having the first film further includes a step of applying an electric potential of between 12V and 20V between the cathode of aluminum and anode including the Nd—Fe—B magnet having the first film of aluminum to oxidize the first film of aluminum on the surface of the Nd—Fe—B magnet to produce the anti-corrosive coating of oxidized aluminum on the surface of the first film of aluminum to prevent the Nd—Fe—B magnet from corroding.

8. The method for preparing the hard aluminum film on the surface of the Nd—Fe—B magnet as set forth in claim 1 wherein said step of depositing the aluminum is further defined as arc ion plating.

9. The method for preparing the hard aluminum film on the surface of the Nd—Fe—B magnet as set forth in claim 1 wherein said step of depositing the aluminum is further defined magnetron sputtering.

10. The method for preparing the hard aluminum film on the surface of the Nd—Fe—B magnet as set forth in claim 1 wherein said step of depositing the aluminum is further defined as magnetic controlled arc ion plating.

11. The method for preparing the hard aluminum film on the surface of the Nd—Fe—B magnet as set forth in claim 1 wherein said step of depositing the aluminum is further defined as vacuum evaporation.

12. A method for preparing a hard aluminum film on a surface of a Nd—Fe—B magnet using a plating machine and an anodic oxidation process using a cathode of aluminum and an anode, said method comprising the steps of;
    grinding the Nd—Fe—B magnet,
    polishing the Nd—Fe—B magnet,
    washing the Nd—Fe—B magnet using an alcohol,
    depositing a first film having a thickness of between 5 µm and 40 µm on the surface of the Nd—Fe—B magnet in the plating machine under a vacuum,
    said step of depositing the first film being further defined as depositing aluminum on the surface of the Nd—Fe—B magnet having the thickness of between 5 µm and 40 μm on the surface of the Nd—Fe—B magnet in the plating machine under the vacuum having a predetermined pressure range of between $2.0\times10^{-3}$ Pa and $9.0\times10^{-3}$ Pa, said step of depositing the aluminum further including a step of adding an inert gas of Argon to the plating machine to raise the predetermined pressure of the vacuum in the plating machine to between 0.2 Pa and 0.8 Pa, said step of depositing the aluminum further including a step of applying an biasing electric voltage in a range of between 350V and 650V to the Nd—Fe—B magnet to clean the Nd—Fe—B magnet, said step of depositing the aluminum further including a step of reducing the biasing electric voltage to a range of between 100V and 200V to allow the depositing of the aluminum film on the surface of the Nd—Fe—B magnet, subjecting the Nd—Fe—B magnet having the first film to the anodic oxidation process under a solution containing an electrolyte to form an anti-corrosive coating on the surface of the first film to prevent the Nd—Fe—B magnet from corroding, said step of subjecting the Nd—Fe—B magnet having the first film to the anodic oxidation process being further defined as subjecting the Nd—Fe—B magnet having the first film of aluminum to the anodic oxidation process under the solution containing the electrolyte selected from at least one of sulfuric acid and chromic acid and boric acid and oxalic acid and present in an amount of between 15 wt. % and 20 wt. %, said step of subjecting the Nd—Fe—B magnet having the first film of aluminum to the anodic oxidation process further including a step of disposing the Nd—Fe—B magnet having the first film of aluminum on the anode of the anodic oxidation process, said step of subjecting the Nd—Fe—B magnet having the first film of aluminum to the anodic oxidation process further including a step of applying an electric potential of between 12V and 20V between the cathode of aluminum and the anode including the Nd—Fe—B magnet having the first film of aluminum to oxidize the first film of aluminum on the surface of the Nd—Fe—B magnet to produce an oxidized aluminum film on the surface of the first film of aluminum to prevent the Nd—Fe—B magnet from corroding.

13. The method for preparing the hard aluminum film on the surface of the Nd—Fe—B magnet as set forth in claim 12 wherein said step of depositing the aluminum is further defined as arc ion plating.

14. The method for preparing the hard aluminum film on the surface of the Nd—Fe—B magnet as set forth in claim 12 wherein said step of depositing the aluminum is further defined magnetron sputtering.

15. The method for preparing the hard aluminum film on the surface of the Nd—Fe—B magnet as set forth in claim 12 wherein said step of depositing the aluminum is further defined as magnetic controlled arc ion plating.

16. The method for preparing the hard aluminum film on the surface of the Nd—Fe—B magnet as set forth in claim 12 wherein said step of depositing the aluminum is further defined as vacuum evaporation.

17. A Nd—Fe—B magnet, comprising;
a first film defining a first Vickers hardness covering the Nd—Fe—B magnet, and
an anti-corrosive coating defining a second Vickers hardness covering said first film on the Nd—Fe—B magnet with said second Vickers hardness being at least eight times said first Vickers hardness of said first film.

18. The Nd—Fe—B magnet as set forth in claim 17 wherein said first film covering the Nd—Fe—B magnet is aluminum and said anti-corrosive coating covering said first film on the Nd—Fe—B magnet is oxidized aluminum.

* * * * *